United States Patent
Tanabe (10) Patent No.: US 6,479,896 B1
(45) Date of Patent: Nov. 12, 2002

(54) SEMICONDUCTOR DEVICE HAVING PROTECTIVE LAYER

(75) Inventor: Mitsuru Tanabe, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/217,249

(22) Filed: Dec. 21, 1998

(30) Foreign Application Priority Data

Jan. 14, 1998 (JP) .......................................... 10-005253

(51) Int. Cl.$^7$ ........................ H01L 23/48; H01L 23/52; H01L 29/40
(52) U.S. Cl. ...................................... 257/745; 257/194
(58) Field of Search .............................. 257/194, 745, 257/284, 615, 189

(56) References Cited

U.S. PATENT DOCUMENTS

| | | | |
|---|---|---|---|
| 5,105,241 A | | 4/1992 | Ando .......................... 257/194 |
| 5,495,115 A | * | 2/1996 | Kudo et al. .................. 257/190 |
| 5,504,353 A | | 4/1996 | Kuzuaura .................... 257/194 |
| 5,789,767 A | * | 8/1998 | Omura ........................ 257/194 |
| 5,856,681 A | * | 1/1999 | Ohshima .................... 257/194 |
| 5,959,317 A | * | 9/1999 | Niwa .......................... 257/194 |
| 6,057,566 A | * | 5/2000 | Eisenbeiser et al. ........ 257/194 |

FOREIGN PATENT DOCUMENTS

| | | |
|---|---|---|
| EP | 0 367 411 | 5/1990 |
| FR | 2 689 318 | 10/1993 |
| JP | 5-259193 | 10/1993 |
| JP | 6-84958 | 3/1994 |

OTHER PUBLICATIONS

N. Yoshida et al., "Alloyed and Non–Alloyed Ohmic Contacts for AlInAs/InGaAs High Electron Mobility Transistors", Jpn. J. Appl. Phys. vol. 33 (1994), Part 1, No. 6A, pp. 3373–3376, Jun. 1994.

E. Mizuki et al., "Highly Reliable Ohmic Contacts for InAlAs/InGaAs Heterojunction FETs", Technical Report of IEICE, ED93–133, CPM93–104, pp. 77–82, Nov. 1993.

K. Kim et al., "Interfacial reactions in the Ti/GaAs system", J. Vac. Sci. Technol. A6 (3), pp. 1473–1477, May/Jun. 1988.

* cited by examiner

Primary Examiner—Phat X. Cao
(74) Attorney, Agent, or Firm—Nixon Peabody LLP; Donald R. Studebaker (57) ABSTRACT

An undoped $In_{0.52}Al_{0.48}As$ buffer layer (thickness: 500 nm), an undoped $In_{0.53}Ga_{0.47}As$ channel layer (thickness: 30 nm), an n-type delta doped layer for shortening the distance between the channel layer and a gate electrode and attaining a desired carrier density, an undoped $In_{0.52}Al_{0.48}As$ Schottky layer, and an n-type $In_{0.53}Ga_{0.47}As$ cap layer doped with Si (thickness: 50 nm) are formed in this order on the principal surface of an Fe-doped InP semi-insulating substrate. An n-type GaAs protective layer doped with Si (thickness: 7.5 nm) is formed between the cap layer and source/drain electrodes for protecting the cap layer.

6 Claims, 13 Drawing Sheets

SEMICONDUCTOR DEVICE HAVING PROTECTIVE LAYER

BACKGROUND OF THE INVENTION

The present invention generally relates to a semiconductor device, and more particularly relates to a high electron mobility transistor (HEMT) used in a millimeter wave band.

In recent years, multimedia applications have rapidly and tremendously broadened in order to catch up with the up-to-date trend of the present information-oriented society. As a result, in the field of mobile communication, large-capacity high-speed communication is now in very high demand. This is because the times now require the transmission of a large quantity of data, like moving pictures, at a much higher speed, to say nothing of still pictures or quasi-moving pictures. In the bands of 0.3 GHz to 3 GHz, currently used by cellular phones and personal handy phone systems (PHS), there are no longer sufficient frequency resources accommodated to meeting such a demand, that is, large-capacity high-speed communication. Thus, the use of a millimeter wave band, having a very wide frequency range of 30 to 300 GHZ, is now under research and development. In order to utilize a millimeter wave band, an active device, attaining a sufficiently high gain and exhibiting excellent low-noise characteristics in the frequency range in question, is required. And a semiconductor layer, where electrons reach a higher saturation velocity, should be used as the electron transportation layer (i.e., a channel layer). Accordingly, it was reported that if an InAlAs/InGaAs HEMT, having a channel layer made of InGaAs with a high saturation velocity, is used, then a maximum oscillation frequency fmax of more than 600 GHz, which belongs to the highest frequency band for active devices, is attained.

However, this InAlAs/InGaAs HEMT also has a problem that the contact resistance of an ohmic contact layer deteriorates with the passage of time (or with the application of heat).

In accordance with one suggested prior art technique, a refractory metal such as tungsten (see, e.g., Jpn. J. Appl. Phys. Vol. 33 (1994), pp. 3373–3376) or molybdenum (see, e.g., Technical Report of Institute of Electronics, Information and Communication Engineers in Japan, ED93-133, CPM93-104 (1993-11), pp. 77-82) is used as a material for an ohmic electrode to prevent this deterioration with time. In general, refractory metals are thermally stable and do not cause counter diffusion with indium (In). However, these refractory metals are ordinarily provided by sputtering during a fabrication process. Accordingly, damage is more likely to be induced in semiconductor crystals and it is not easy to form an ohmic electrode with small contact resistance. Also, molybdenum (Mo) is oxidized very easily, though Mo is formed by an evaporation technique not inducing so much damage. Thus, the metal should be treated very carefully during a fabrication process. For example, a wet treatment should be avoided after the electrode has been made of Mo.

According to another suggested prior art technique, a GaAs layer is formed between a cap layer containing In and an ohmic electrode to protect the cap layer (see, e.g., Japanese Laid-Open Publication No. 6-84958). In accordance with this method, a typical three-layer stack of Ti/Pt/Au may be used as a material for the electrode. Accordingly, this method easily fit in with conventional fabrication processes for GaAs MESFETs and pseudomorphic HEMTs.

In a HEMT formed by the latter prior art technique, a GaAs protective layer is formed between a cap layer and an ohmic electrode. Accordingly, although the contact resistance of the electrode is low immediately after the fabrication thereof, the resistance possibly increases with time depending on the thickness of the protective layer.

SUMMARY OF THE INVENTION

In view of these conventional problems, the objects of the present invention are reducing the contact resistance of an ohmic electrode and preventing the increase of the resistance with the passage of time.

In order to accomplish these objects, the thickness of a protective layer made of GaAs and provided between a cap layer made of a semiconductor containing In and an ohmic electrode is optimized according to the present invention.

The semiconductor device of the present invention includes: a cap layer formed on a substrate and made of a semiconductor including In; an ohmic electrode formed over the cap layer; and a protective layer formed between the cap layer and the ohmic electrode and made of n-type GaAs. The protective layer prevents In atoms, contained in the cap layer, from diffusing toward the ohmic electrode and also prevents metal atoms, contained in the ohmic electrode, from diffusing toward the cap layer. The thickness of the protective layer is larger than 5 nm and smaller than 15 nm.

In the semiconductor device of the present invention, the thickness of the n-type GaAs protective layer, formed between the cap layer made of a semiconductor including In and the ohmic electrode, is larger than 5 nm and smaller than 15 nm. Accordingly, neither defects nor dislocations, which are ordinarily found in a protective layer in remarkable numbers, are caused in this protective layer. Thus, the contact resistance can be kept sufficiently low between the cap layer and the ohmic electrode and does not increase with the passage of time. As a result, a semiconductor device, exhibiting stabilized electrical characteristics for a longer period of time, can be obtained.

In one embodiment of the present invention, the protective layer preferably includes an n-type delta doped layer.

In such an embodiment, a well is formed in the conduction band of the n-type delta doped layer. Accordingly, the effective thickness of the energy barrier layer decreases, and therefore tunneling current is even more likely to flow than the case of providing the n-type GaAs protective layer alone. As a result, the contact resistance between the cap layer and the ohmic electrode can be further reduced.

In another embodiment of the present invention, the substrate is preferably a semi-insulating substrate made of InP.

In such an embodiment, a HEMT containing In can be formed with more certainty.

In still another embodiment of the present invention, the substrate is preferably a semi-insulating substrate made of GaAs.

In such an embodiment, a HEMT can be formed at a lower cost.

BRIEF DESCRIPTION OF THE DRAWINGS

FIGS. 2(a) through 2(c) are cross-sectional views schematically illustrating how the counter diffusion of In and Ti in a three-layer stack of InGaAs/GaAs/Ti for the semiconductor device of the present invention changes with the thickness of the GaAs layer:

DESCRIPTION OF THE PREFERRED EMBODIMENTS

The present inventor carried out various sorts of experiments on the thickness of an n-type GaAs protective layer provided between a cap layer containing In and an ohmic electrode for protecting the cap layer. As a result, I made the following findings.

Figure 1:
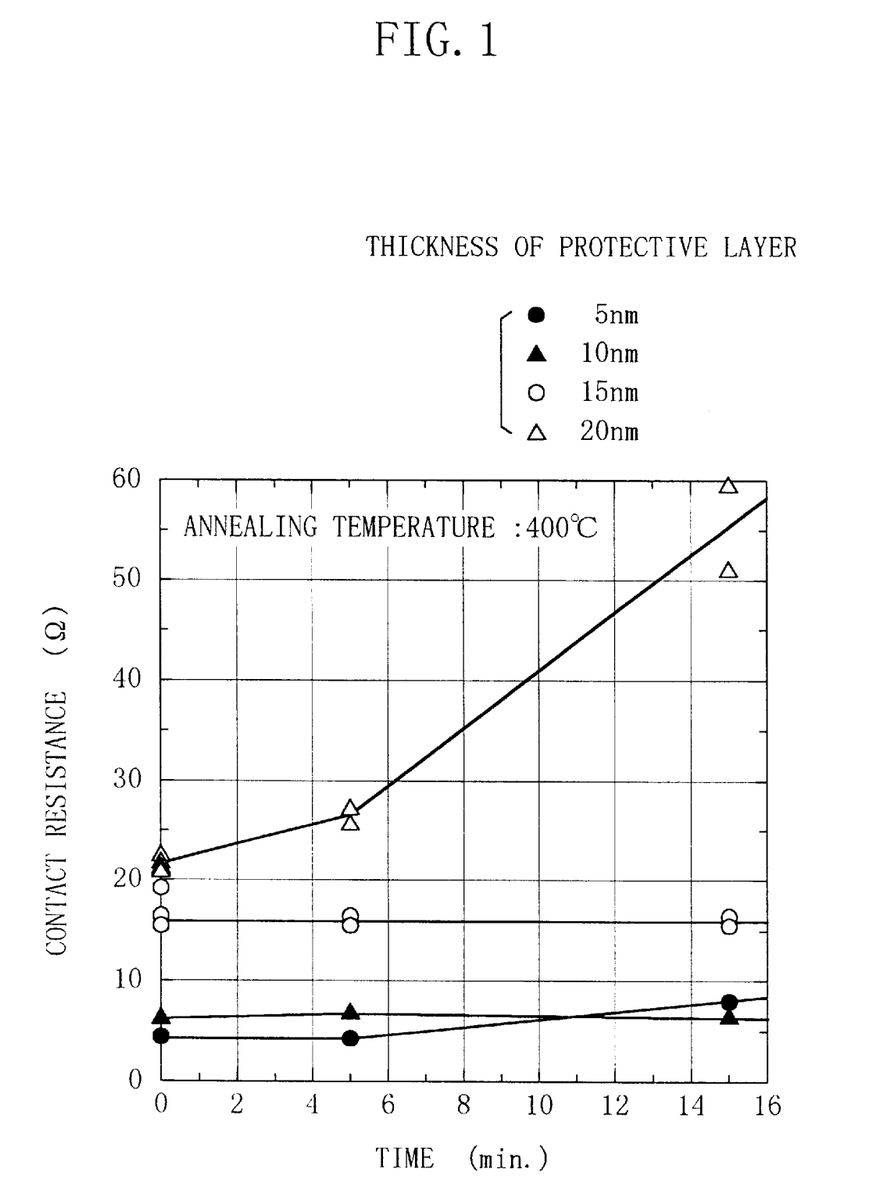
FIG. 1 is a graph illustrating respective relationships between the contact resistance and the time for various thicknesses of a protective layer provided for the semiconductor device of the present invention to protect a cap layer.

FIG. 1 illustrates respective relationships between the contact resistance and the time for various thicknesses of the GaAs protective layer formed on the InGaAs cap layer. The plots identified with ●, ▲, ○ and Δ indicate cases where the thicknesses of the protective layer are 5, 10, 15 and 20 nm, respectively. In this case, a semi-insulating substrate made of InP and doped with iron (Fe) beforehand is used. And an InGaAs cap layer, a GaAs protective layer and a multilayer ohmic electrode, of which the lowermost layer is made of Ti, are formed in this order on the semi-insulating substrate. Thereafter, the substrate with these layers stacked thereon is subjected to a heat treatment under the testing conditions shown in FIG. 1, i.e., annealed at 400° C. for about 15 minutes within a nitrogen ambient. It is known that if GaAs and Ti are heated up to 380° C. or more, then thermally stable TiAs is usually formed in the interface between GaAs and Ti (see, for example, J. Vac. Sci. Technol. A, Vol. 6, No. 3, May/June 1988). Also, the properties of the interface between InGaAs and GaAs are invariable in a pseudomorphic HEMT, even if this stack is subjected to an ohmic sintering treatment at 450° C. In other words, the thermal stability of this interface has already been proven. Thus, the three-layer structure of InGaAs/GaAs/Ti is believed to be thermally stable.

However, as shown in FIG. 1, the contact resistance still increases in both cases where the thicknesses of the GaAs protective layer are 5 nm and 20 nm. Accordingly, if the thickness of the protective layer is larger than 5 nm and smaller than 20 nm, more preferably larger than 5 nm and smaller than 15 nm, then the thickness is optimized and the increase in contact resistance with time can be avoided. In this specification, this result will be called a "first experimental result".

The results of further experiments conducted about this phenomenon will be described with reference to the drawings.

Figure 2A:
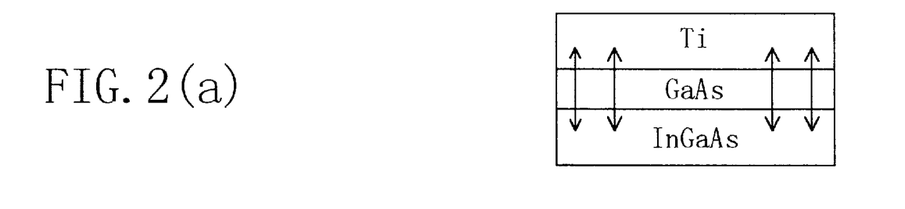
FIG. 2(a) illustrates a case where the thickness of the GaAs layer is smaller than an optimum value.
Figure 2B:
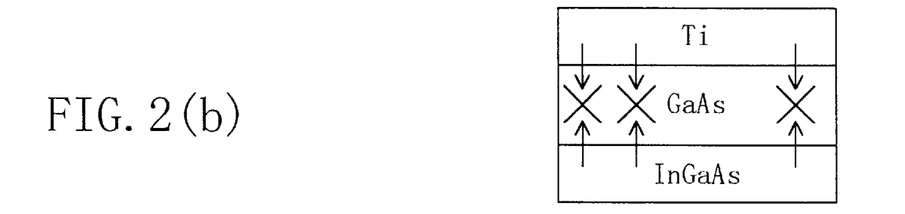
FIG. 2(b) illustrates a case where the thickness of the GaAs layer is at the optimum value.
Figure 2C:
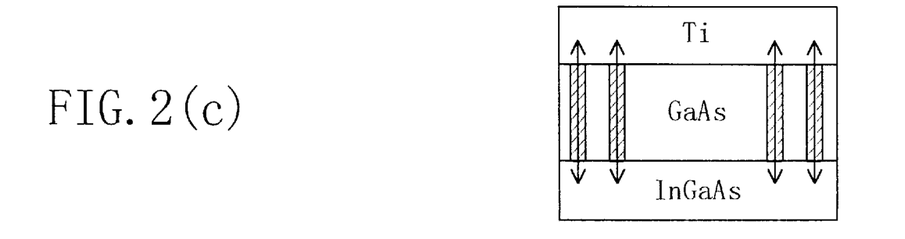
FIG. 2(c) illustrates a case where the thickness of the GaAs layer is larger than the optimum value.

FIGS. 2(a) through 2(c) schematically illustrate three types of cross-sectional structures for the three-layered semiconductor film of InGaAs/GaAs/Ti. Specifically, FIG. 2(a) illustrates a case where the thickness of the GaAs layer is 5 nm, which is smaller than the optimum value. FIG. 2(b) illustrates a case where the thickness of the GaAs layer is at the optimum value. And FIG. 2(c) illustrates a case where the thickness of the GaAs layer is about 20 nm, which is larger than the optimum value. As shown in FIG. 2(a), if the thickness of the GaAs layer is smaller than the optimum value, the counter diffusion of In, contained in the lowermost InGaAs layer, and Ti, contained in the uppermost layer, is caused via the intermediate GaAs layer. The contact resistance increases in this case probably because of this phenomenon. On the other hand, if the thickness of the GaAs layer is larger than the optimum value as shown in FIG. 2(c), then the contact resistance also increases. This is probably because the counter diffusion of Ti and In from the uppermost and lowermost layers, respectively, is caused through fine-line gaps formed in crystals in the GaAs layer owing to the generation of a large number of lattice defects and dislocations. Such defects and dislocations are generated because the lattice constant of InGaAs is different from that of GaAs.

Accordingly, if the thickness of the GaAs layer is at the optimum value in the range from more than 5 nm to less than 20 nm, then no remarkable defects or dislocations are generated in the GaAs layer as shown in FIG. 2(b). As a result, the interfaces between GaAs and Ti and between InGaAs and GaAs would be both kept intact and the intermediate GaAs layer would effectively function as a protective layer for the lowermost InGaAs layer.

Next, the relationship between the resistance and the thickness of the GaAs layer in the two-layered semiconductor film of InGaAs/GaAs, obtained without taking the deterioration with time into consideration, will be described.

Figure 3:
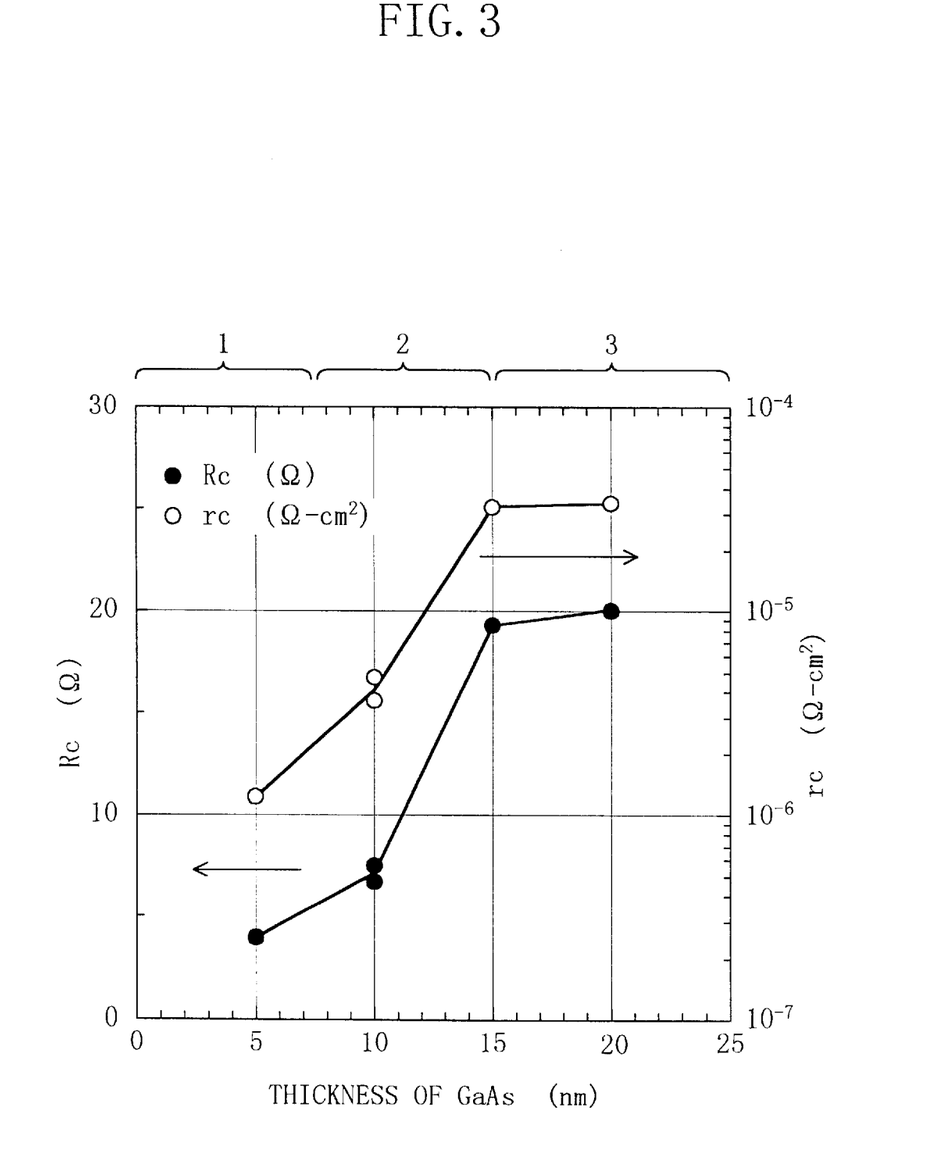
FIG. 3 is a graph illustrating respective relationships between the contact resistance and the thickness of a GaAs layer and between the specific contact resistance and the thickness of the GaAs layer in a two-layer semiconductor film of InGaAs/GaAs provided for the semiconductor device of the present invention.

FIG. 3 illustrates respective relationships between the contact resistance and the thickness of the GaAs layer and between the specific contact resistance and the thickness of the GaAs layer in the two-layered semiconductor film of InGaAs/GaAs without taking the deterioration with time into consideration.

As shown in FIG. 3, the respective behaviors of the contact resistance and resistivity can be classified into the following three regions. Namely, a low-resistance region 1 with contact resistance closer to that of InGaAs; a transitional region 2 with contact resistance intermediate between those of InGaAs and GaAs; and a high-resistance region 3 with contact resistance closer to that of GaAs. In FIG. 3, the plots identified with ● and ○ indicate the contact resistance Rc and the specific contact resistance rc, respectively. As shown in FIG. 3, if the thickness of the GaAs layer is set at 10 nm or less in the two-layered semiconductor film of InGaAs/GaAs, then low contact resistance can be obtained. In this specification, this result will be called a "second experimental result".

In view of the first and second experimental results, it can be understood that the thickness of the GaAs protective layer should be in the range from more than 5 nm to less than 15 nm to keep the contact resistance low and prevent the deterioration with time.

Embodiment 1

Hereinafter, the first embodiment of the present invention will be described with reference to the drawings.

Figure 4:
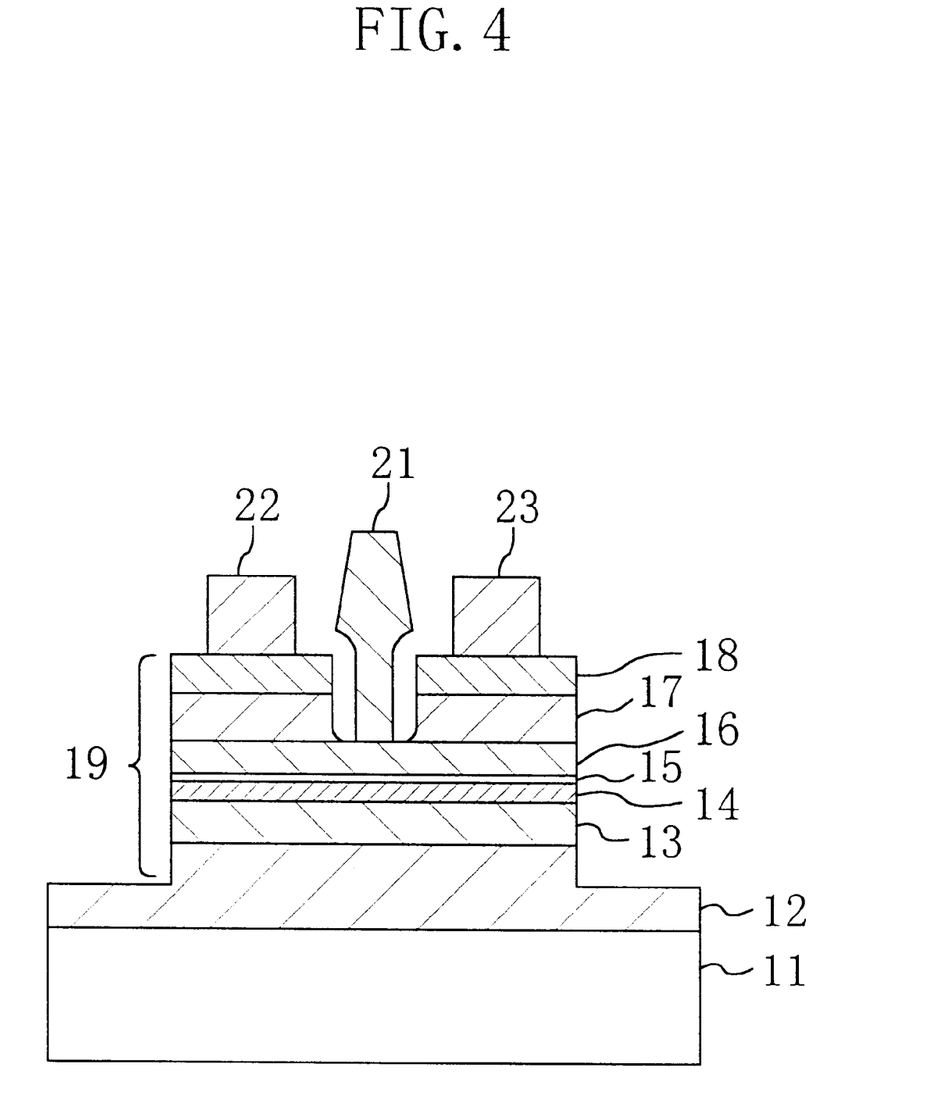
FIG. 4 is a cross-sectional view illustrating the structure of a semiconductor device according to the first embodiment of the present invention.

FIG. 4 illustrates a cross-sectional structure of a HEMT as a semiconductor device according to the first embodiment of the present invention. As shown in FIG. 4, a buffer layer 12, made of undoped $In_{0.52}Al_{0.48}As$ (thickness: 500 nm), for compensating for induced dislocations in respective semiconductor layers to be grown on an Fe-doped semi-insulating substrate 11 made of InP is formed on the principal surface thereof. On the buffer layer 12, a channel layer 13, which is made of undoped $In_{0.53}Ga_{0.47}As$ (thickness: 30 nm) and where electrons move as carriers, is formed. On the channel layer 13, a spacer layer 14, made of undoped $In_{0.52}Al_{0.48}As$ (thickness: 3 nm), for separating the channel layer 13 from a Schottky layer (described below) is formed. On the spacer layer 14, an n-type delta doped layer 15, made of silicon (Si), for shortening the distance between the channel layer 13 and a gate electrode (described below) without decreasing the drain breakdown voltage and attaining a predetermined carrier density, is formed. On the n-type delta doped layer 15, a Schottky layer 16, made of undoped $In_{0.52}Al_{0.48}As$ (thickness: 30 nm), for making Schottky contact with the gate electrode, is formed. On the Schottky layer 16, a cap layer 17, made of n-type $In_{0.53}Ga_{0.47}As$ doped with Si (thickness: 50 nm) and functioning as an ohmic contact layer, is formed. And on the cap layer 17, a protective layer 18, made of n-type GaAs doped with Si (thickness: 7.5 nm), for protecting the cap layer 17 is formed.

A recess is provided in the protective layer 18 and the cap layer 17 to expose the Schottky layer 16 and divide these layers 17, 18 into two. A gate electrode 21, consisting of a head portion and a leg portion extending downward from the head portion, is formed in the recess. And source/drain electrodes 22 and 23, each made of Ti/Pt/Au stacked in this (ascending) order and making ohmic contact with the protective layer 18, are formed on the upper surface of the protective layer 18.

In this embodiment, the protective layer 18, made of n-type GaAs to be 7.5 nm thick, is formed between the cap layer 17 made of n-type $In_{0.53}Ga_{0.47}As$ and the source/drain electrodes 22, 23 making ohmic contact with the cap layer 17. Accordingly, a HEMT, having low contact resistance not increasing with time as described in the experimental results, can be obtained.

Hereinafter, a method for fabricating the HEMT having such a structure will be described with reference to the drawings.

Figure 5A:
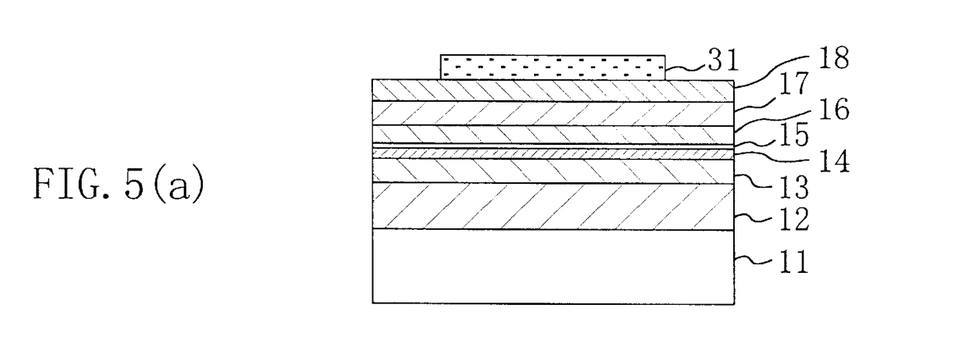
FIGS. 5(a) through 5(c) are cross-sectional views illustrating respective process steps for fabricating the semiconductor device of the first embodiment.

FIGS. 5(a) through 7(c) illustrate cross-sectional structures corresponding to respective process steps for fabricating the HEMT of the first embodiment. First, as shown in FIG. 5(a), the undoped $In_{0.52}Al_{0.48}As$ buffer layer 12 (thickness: 500 nm), the undoped $In_{0.53}Ga_{0.47}As$ channel layer 13 (thickness: 30 nm), the undoped $In_{0.52}Al_{0.48}As$ spacer layer 14 (thickness: 3 nm), the n-type delta doped layer 15 made of Si, the undoped $In_{0.52}Al_{0.48}As$ Schottky layer 16 (thickness: 30 nm), the n-type $In_{0.53}Ga_{0.47}As$ cap layer 17 doped with Si (thickness: 50 nm), and the n-type GaAs protective layer 18 doped with Si (thickness: 7.5 nm) are epitaxially grown in this order on the principal surface of the Fe-doped InP semi-insulating substrate 11 by an MBE technique, for example. Thereafter, a first resist pattern 31, masking a region where a transistor is to be formed, is defined on the upper surface of the protective layer 18.

Figure 5B:
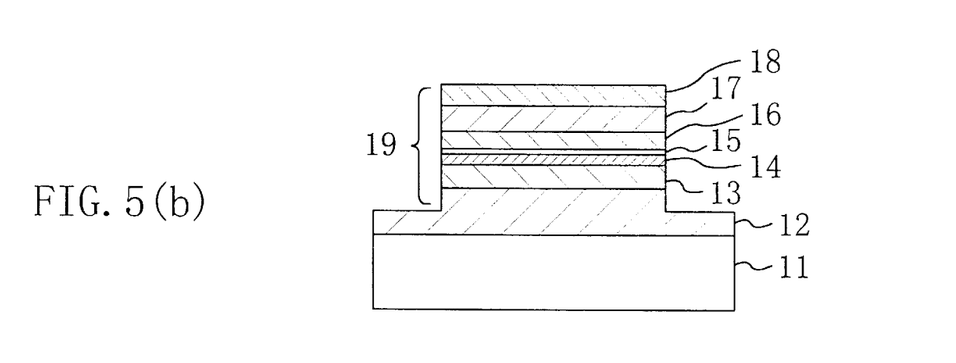

Next, as shown in FIG. 5(b), the epitaxial layers are etched with a phosphate-based etchant, for example, using the first resist pattern 31 as a mask, thereby forming a mesa portion 19 out of these epitaxial layers. Then, the first resist pattern 31 is removed.

Figure 5C:
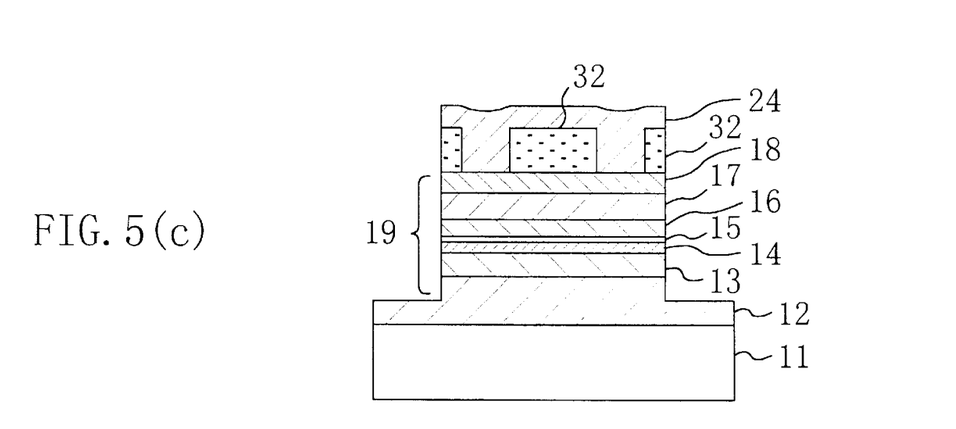

Thereafter, as shown in FIG. 5(c), a second resist pattern 32, having respective openings over the regions where source and drain are to be formed, is defined on the upper surface of the protective layer 18. Then, ohmic metals such as Ti, Pt and Au are evaporated in this order over the entire surface of the substrate 11, thereby depositing a first metal film 24.

Figure 6A:
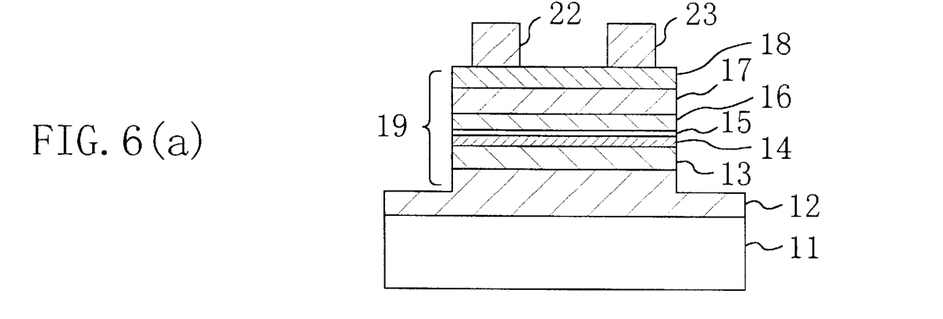
FIGS. 6(a) through 6(c) are cross-sectional views illustrating respective process steps for fabricating the semiconductor device of the first embodiment.

Next, as shown in FIG. 6(a), the second resist pattern 32 is lifted off to form the source/drain electrodes 22, 23 out of the first metal film 24 on the upper surface of the protective layer 18.

Figure 6B:
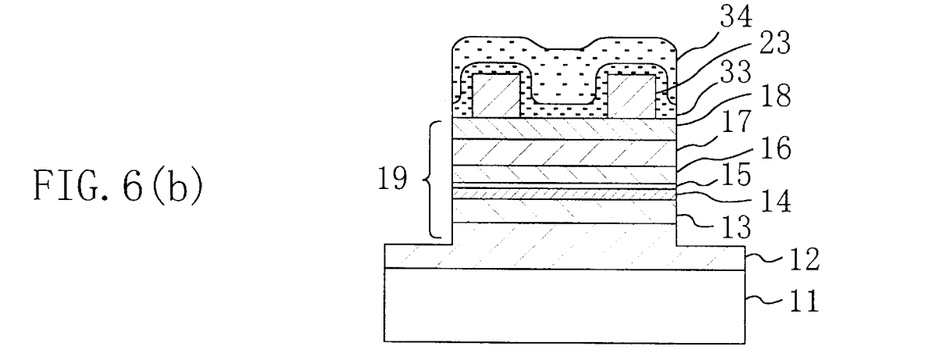

Subsequently, as shown in FIG. 6(b), the entire surface of the substrate 11 is coated with a first EB resist film 33 made of a resist such as PMMA sensitive to electron beams (EB) and with a second EB resist film 34 made of P(MMA/MAA) (i.e., poly(methylmethacrylate-co-methacrylate acid) in this order.

Figure 6C:
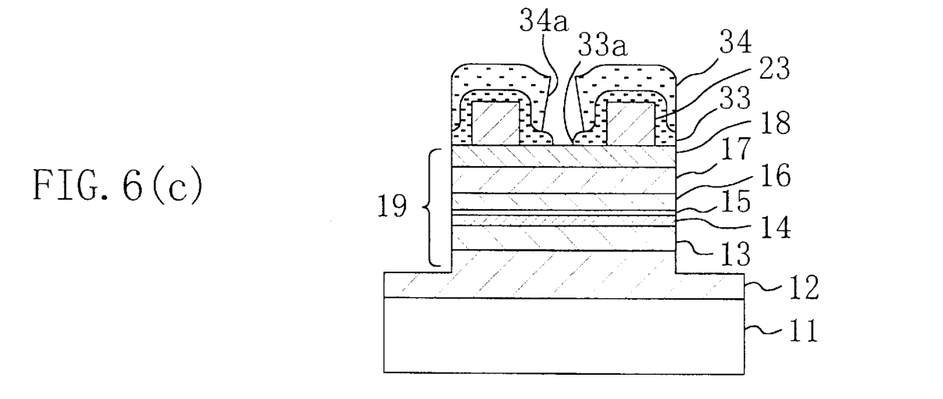

Then, as shown in FIG. 6(c), the second EB resist film 34 is exposed to electron beams and developed, thereby forming a first space pattern 34a to be the head portion of the gate electrode having a size of 0.5 μm, for example, in the gate longitudinal direction. And the first resist film 33 is irradiated with electron beams, thereby forming a second space pattern 33a to be the leg portion of the gate electrode having a size of 0.1 μm, for example, in the gate longitudinal direction.

Figure 7A:
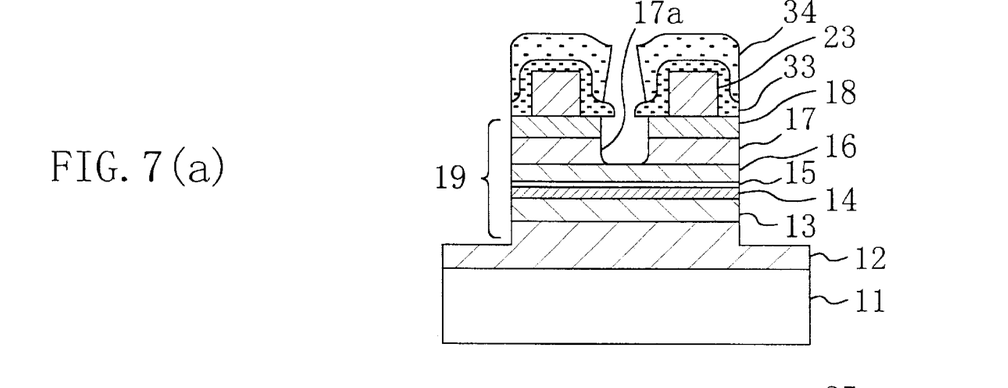
FIGS. 7(a) through 7(c) are cross-sectional views illustrating respective process steps for fabricating the semiconductor device of the first embodiment.
Figure 7B:
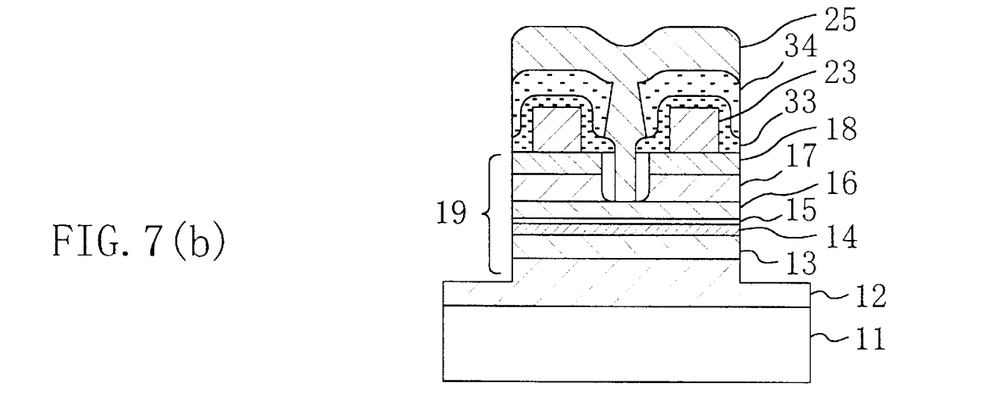
Figure 7C:
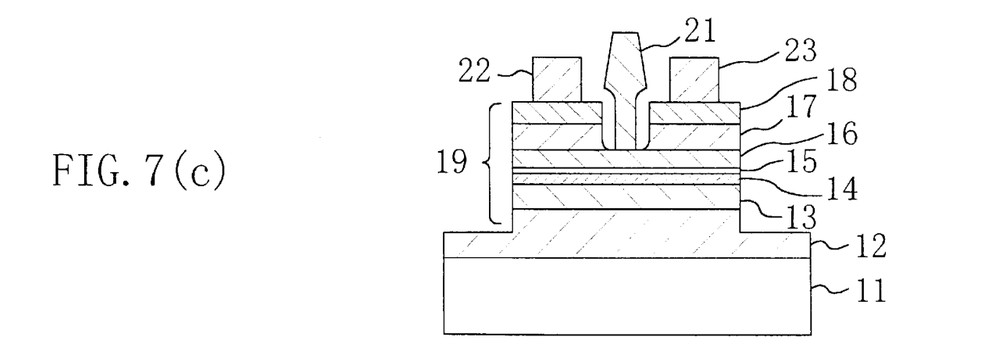

Next, as shown in FIG. 7(a), the cap layer 17 and the protective layer 18 are etched with a phosphate-based etchant, thereby forming the recess 17a in these layers 17, 18. Then, as shown in FIG. 7(b), gate metals such as Ti, Pt and Au are evaporated in this order over the entire surface of the substrate 11, thereby depositing a second metal film 25. And the first and second EB resist films 33, 34 are lifted off, thereby exposing the source/drain electrodes 22, 23 and forming the gate electrode 21, consisting of the head and leg portions, out of the second metal film 25 in the recess 17a on the Schottky layer 16 as shown in FIG. 7(c).

In the HEMT formed in this manner, the n-type GaAs protective layer 18 for preventing In, contained in the cap layer 17, from diffusing toward the ohmic electrodes, i.e., the source/drain electrodes 22, 23, has a thickness of 7.5 nm. Thus, as can be understood from the experimental results described above, the contact resistance between the cap layer 17 and the ohmic electrodes can be reduced and kept low for a long period of time. As a result, the thermal reliability of the HEMT can be improved.

Figure 8:
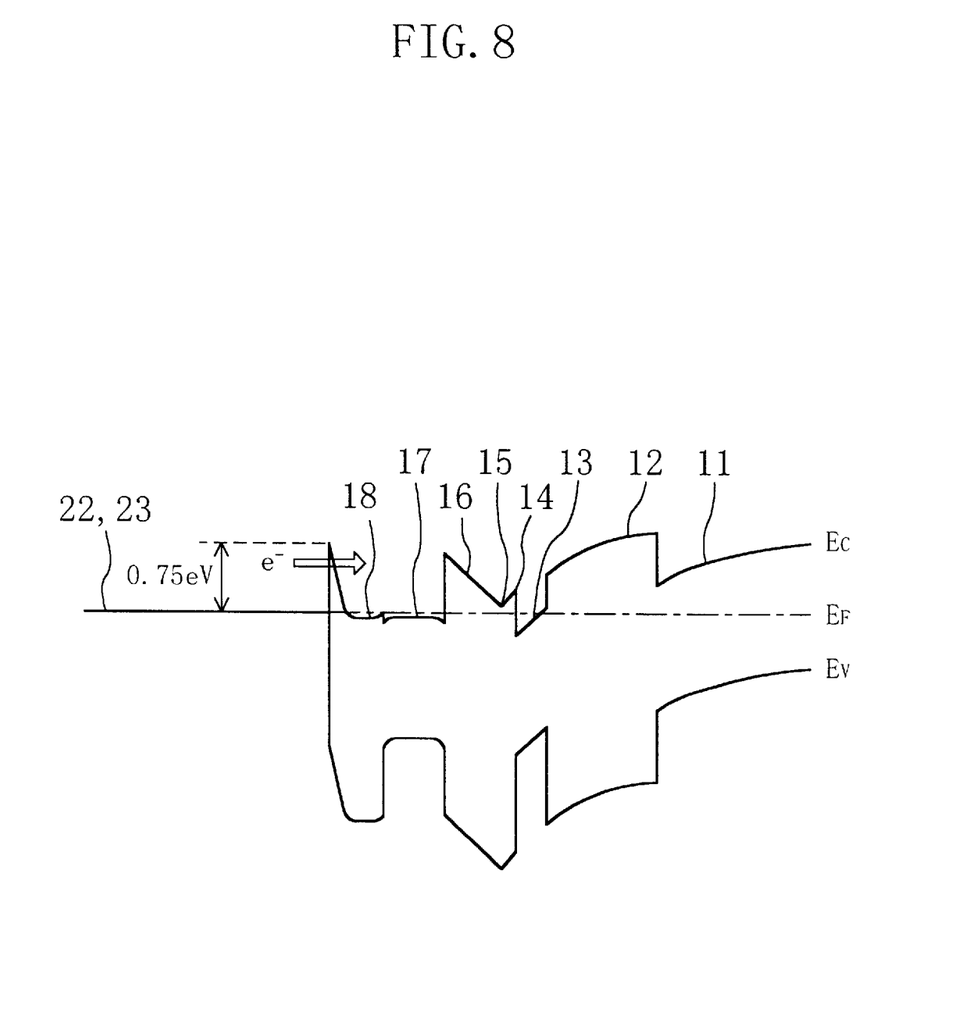
FIG. 8 is an energy-level diagram illustrating the energy levels of respective semiconductor layers in the semiconductor device of the first embodiment.

FIG. 8 illustrates the energy levels of respective semiconductor layers in the HEMT of the first embodiment. In FIG. 8, the energy levels of the respective layers are identified by the same reference numerals as those used in FIG. 4. As shown in FIG. 8, Ti contained in the source/drain electrodes 22, 23 is in Schottky contact with GaAs contained in the protective layer 18. The height of the energy barrier thereof is as large as 0.75 eV. However, in this embodiment, the thickness of the protective layer 18 is optimized at 7.5 nm and therefore tunneling current can flow through the energy barrier of the protective layer 18. As a result, contact resistance can be kept low.

The substrate 11 is made of InP in this embodiment. Alternatively, a semi-insulating substrate made of GaAs may also be used. Since a high-quality substrate is readily available in such a case, the fabrication cost of a HEMT can be reduced.

In this embodiment, a field effect transistor is exemplified as a semiconductor device of the present invention. However, the present invention is in no way limited to such an embodiment. The same effects can be attained if the present invention is applied to any other semiconductor device including a cap layer (ohmic contact layer) made of a semiconductor containing In. For example, the present invention is applicable to an optical device such as a semiconductor laser device.

Embodiment 2

Hereinafter, the second embodiment of the present invention will be described with reference to the drawings.

Figure 9:
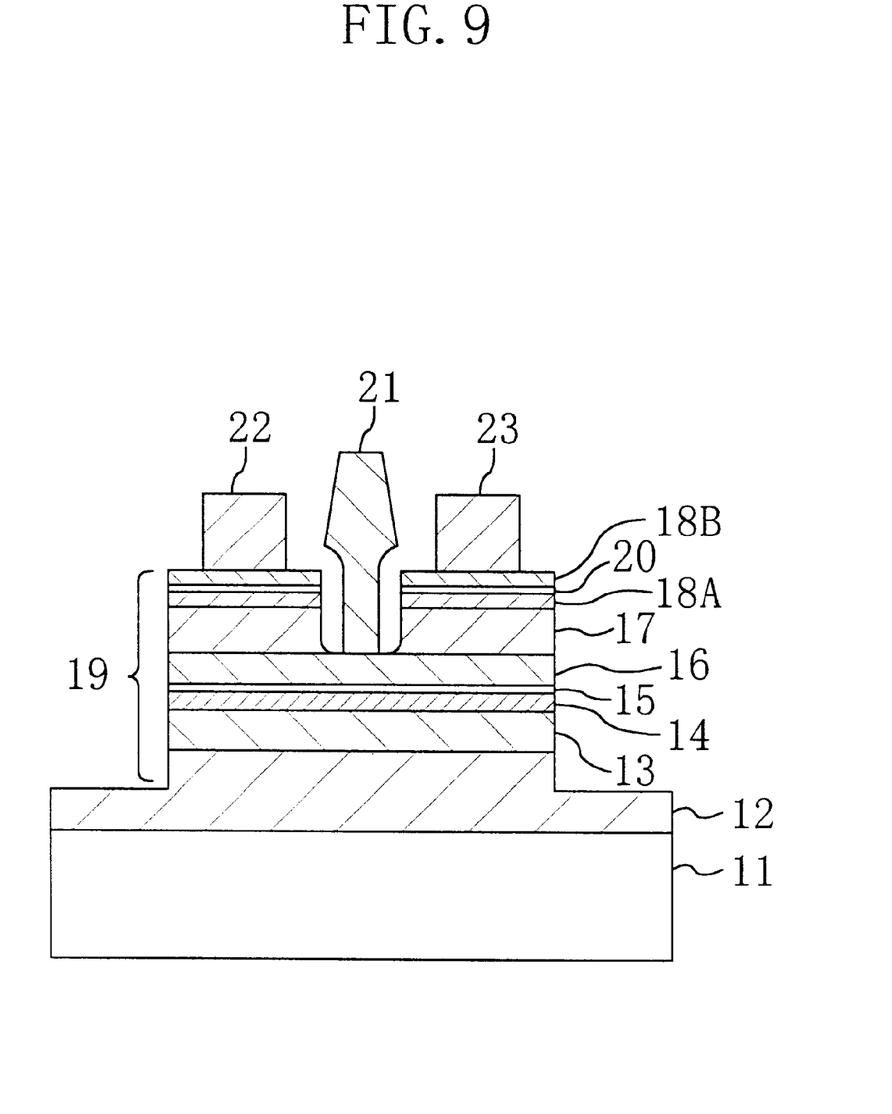
FIG. 9 is a cross-sectional view illustrating the structure of a semiconductor device according to the second embodiment of the present invention.

FIG. 9 illustrates a cross-sectional structure of a HEMT as a semiconductor device according to the second embodiment of the present invention. As shown in FIG. 9, a buffer layer 12, made of undoped $In_{0.52}Al_{0.48}As$ (thickness: 500 nm), for compensating for induced dislocations in respective semiconductor layers to be grown on an Fe-doped semi-insulating substrate 11 made of InP is formed on the principal surface thereof. On the buffer layer 12, a channel layer 13, which is made of undoped $In_{0.53}Ga_{0.47}As$ (thickness: 30 nm) and where electrons move as carriers, is formed. On the channel layer 13, a spacer layer 14, made of undoped $In_{0.52}Al_{0.48}As$ (thickness: 3 nm), for separating the channel layer 13 from a Schottky layer (described below) is formed. On the spacer layer 14, a first n-type delta doped layer 15, made of silicon (Si), for shortening the distance between the channel layer 13 and a gate electrode (described below) without decreasing the drain breakdown voltage and attaining a predetermined carrier density, is formed. On the first n-type delta doped layer 15, a Schottky layer 16, made of undoped $In_{0.52}Al_{0.48}As$ (thickness: 30 nm), for making Schottky contact with the gate electrode, is formed. On the Schottky layer 16, a cap layer 17, made of n-type $In_{0.53}Ga_{0.47}As$ doped with Si (thickness: 50 nm) and functioning as an ohmic contact layer, is formed. On the cap layer 17, a first protective layer 18A, made of n-type GaAs doped with Si (thickness: 3.5 nm), for protecting the cap layer 17 is formed. And over the first protective layer 18A, a second protective layer 18B, made of n-type GaAs doped with Si (thickness: 4 nm), for protecting the cap layer 17 is formed.

This embodiment is characterized in that a second n-type delta doped layer 20, made of silicon, is formed between the first and second protective layers 18A, 18B for reducing the thickness of the Schottky barrier between these layers 18A, 18B.

A recess is provided in the first and second protective layers 18A, 18B and the cap layer 17 to expose the Schottky layer 16 and divide these layers 17, 18A, 18B into two. A gate electrode 21, consisting of a head portion and a leg portion extending downward from the head portion, is formed in the recess. And source/drain electrodes 22 and 23, each made of Ti/Pt/Au and making ohmic contact with the second protective layer 18B, are formed on the upper surface of the second protective layer 18B.

In this embodiment, the first and second protective layers 18, made of n-type GaAs to be 7.5 nm thick in total, is formed between the cap layer 17 made of n-type $In_{0.53}Ga_{0.47}As$ and the source/drain electrodes 22, 23 making ohmic contact with the cap layer 17. Accordingly, a HEMT, having low contact resistance not increasing with time as described above, can be obtained.

Figure 10:
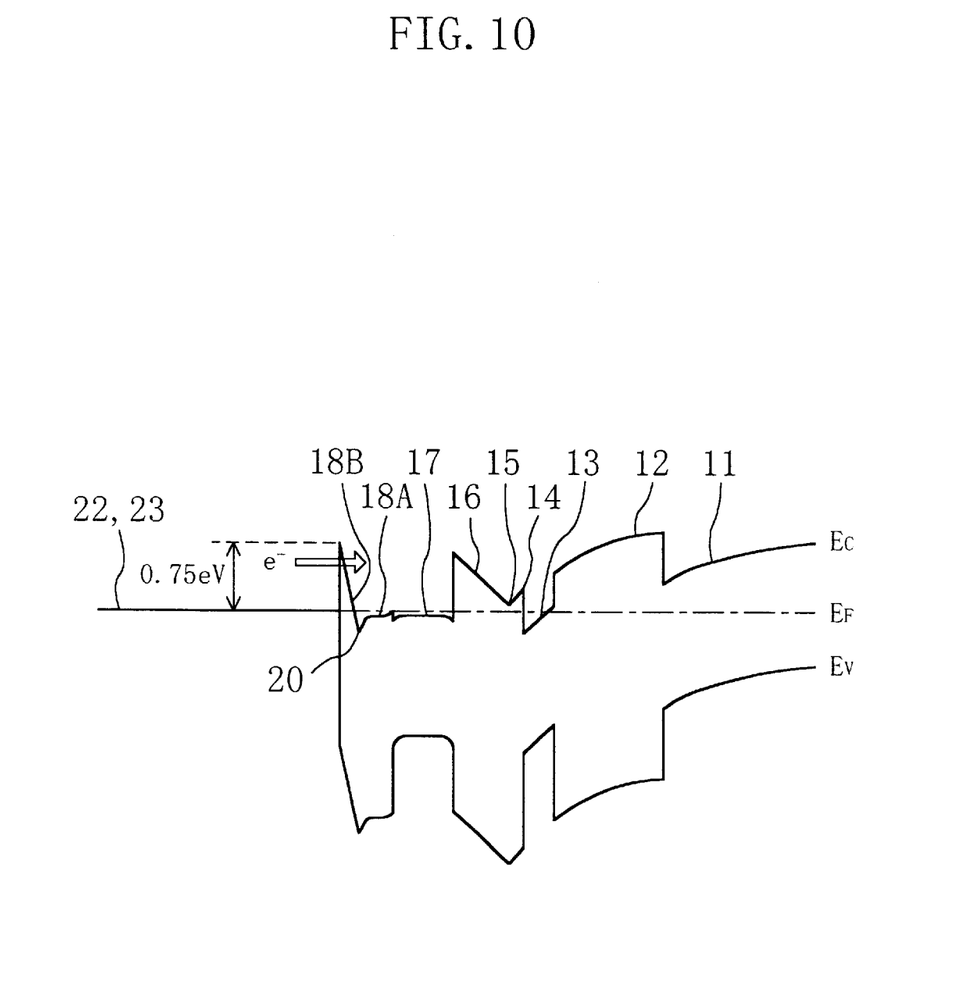
FIG. 10 is an energy-level diagram illustrating the energy levels of respective semiconductor layers in the semiconductor device of the second embodiment.

In addition, the second n-type delta doped layer 20 is further provided between the first and second protective layers 18A, 18B in this embodiment. Thus, a well is formed in the conduction band $E_c$ of the second n-type delta doped layer 20 as shown in the energy-level diagram of FIG. 10, and the effective thickness of the energy barrier layer decreases. Accordingly, the tunneling current is even more likely to flow compared with forming the n-type GaAs protective layer alone. As a result, the contact resistance between the cap layer 17 and the source/drain electrodes 22, 23 as ohmic electrodes can be further reduced.

Hereinafter, a method for fabricating the HEMT having such a structure will be described with reference to the drawings.

Figure 11A:
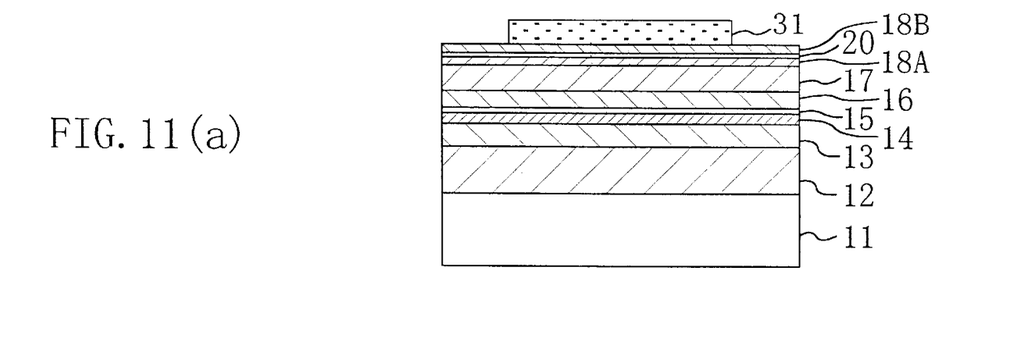
FIGS. 11(a) through 11(c) are cross-sectional views illustrating respective process steps for fabricating the semiconductor device of the second embodiment.

FIGS. 11(a) through 13(c) illustrate cross-sectional structures corresponding to respective process steps for fabricating the HEMT of the second embodiment. First, as shown in FIG. 11(a), the undoped $In_{0.52}Al_{0.48}As$ buffer layer 12 (thickness: 500 nm), the undoped $In_{0.53}Ga_{0.47}As$ channel layer 13 (thickness: 30 nm), the undoped $In_{0.52}Al_{0.48}As$ spacer layer 14 (thickness: 3 nm), the first n-type delta doped layer 15 made of Si, the undoped $In_{0.52}Al_{0.48}As$ Schottky layer 16 (thickness: 30 nm), the n-type $In_{0.53}Ga_{0.47}As$ cap layer 17 doped with Si (thickness: 50 nm), the first n-type GaAs protective layer 18A doped with Si (thickness: 3.5 nm), the second n-type delta doped layer 20 made of Si and the second n-type GaAs protective layer 18B doped with Si (thickness: 4 nm) are epitaxially grown in this order on the principal surface of the Fe-doped InP semi-insulating substrate 11 by an MBE technique, for example. Thereafter, a first resist pattern 31, masking a region where a transistor is to be formed, is defined on the upper surface of the second protective layer 18B.

Figure 11B:
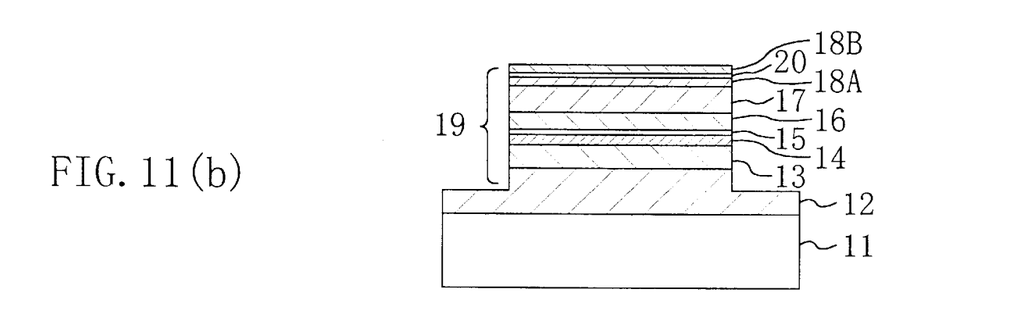

Next, as shown in FIG. 11(b), the epitaxial layers are etched with a phosphate-based etchant, for example, using the first resist pattern 31 as a mask, thereby forming a mesa portion 19 out of these epitaxial layers. Then, the first resist pattern 31 is removed.

Figure 11C:
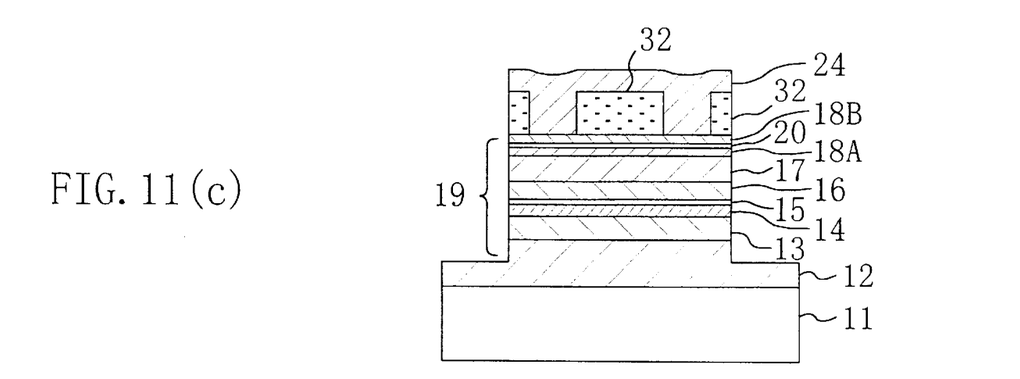

Thereafter, as shown in FIG. 11(c), a second resist pattern 32, having respective openings over the regions where source and drain are to be formed, is defined on the upper surface of the second protective layer 18B. Then, ohmic metals such as Ti, Pt and Au are evaporated in this order over the entire surface of the substrate 11, thereby depositing a first metal film 24.

Figure 12A:
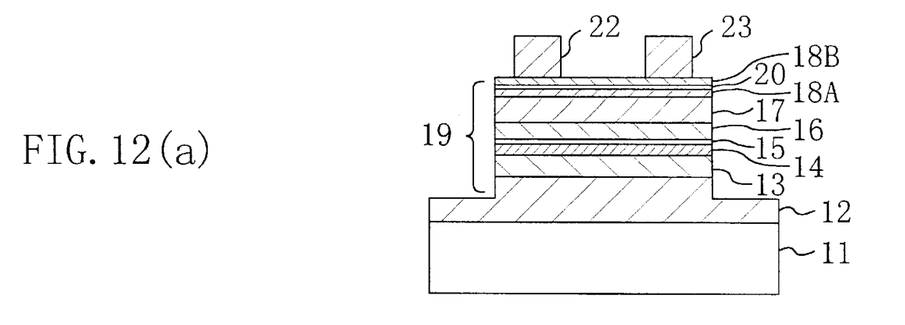
FIGS. 12(a) through 12(c) are cross-sectional views illustrating respective process steps for fabricating the semiconductor device of the second embodiment.

Next, as shown in FIG. 12(a), the second resist pattern 32 is lifted off to form the source/drain electrodes 22, 23 out of the first metal film 24 on the upper surface of the second protective layer 18B.

Figure 12B:
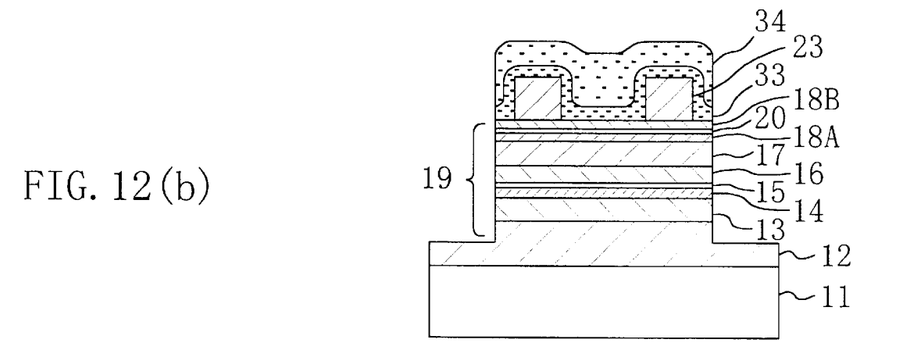

Subsequently, as shown in FIG. 12(b), the entire surface of the substrate 11 is coated with a first EB resist film 33 made of a resist such as PMMA sensitive to electron beams (EB) and a second EB resist film 34 made of P(MMA/MAA) in this order.

Figure 12C:
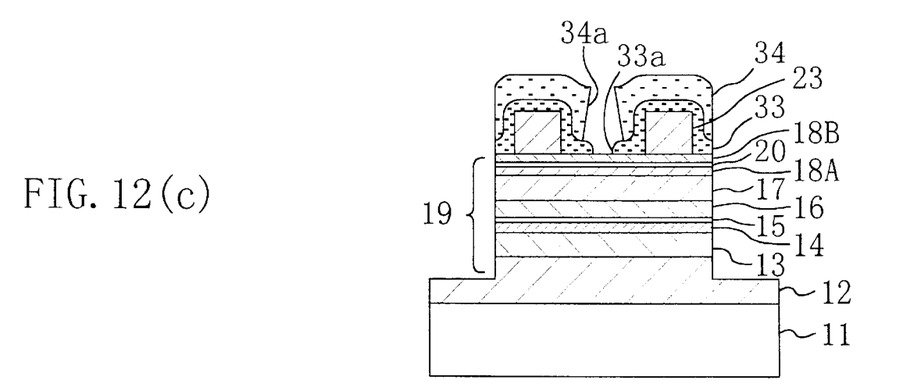

Then, as shown in FIG. 12(c), the second EB resist film 34 is exposed to electron beams and developed, thereby forming a first space pattern 34a to be the head portion of the gate electrode having a size of 0.5 μm, for example, in the gate longitudinal direction. And the first resist film 33 is irradiated with electron beams, thereby forming a second space pattern 33a to be the leg portion of the gate electrode having a size of 0.1 μm, for example, in the gate longitudinal direction.

Figure 13A:
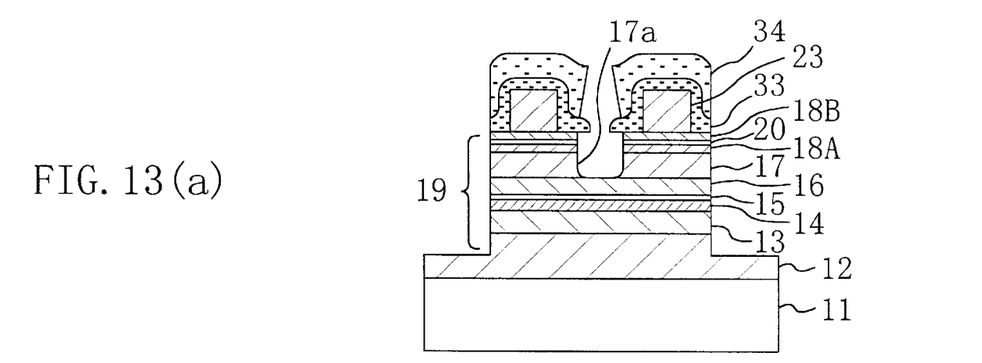
FIGS. 13(a) through 13(c) are cross-sectional views illustrating respective process steps for fabricating the semiconductor device of the second embodiment.
Figure 13B:
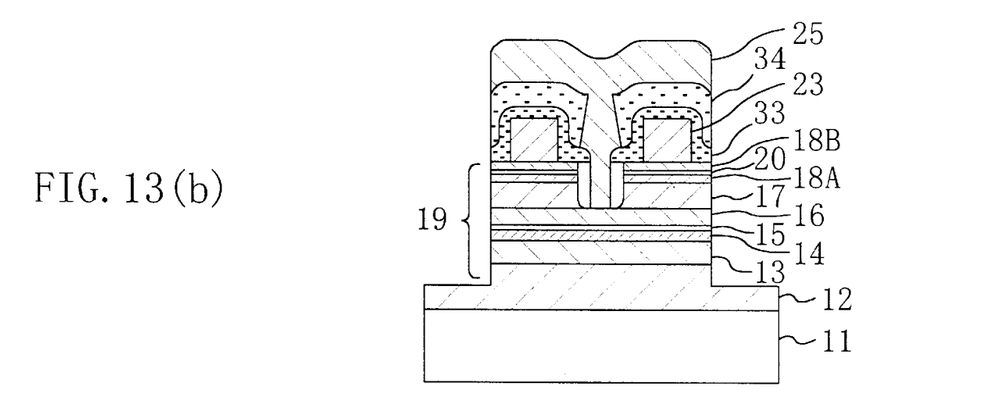
Figure 13C:
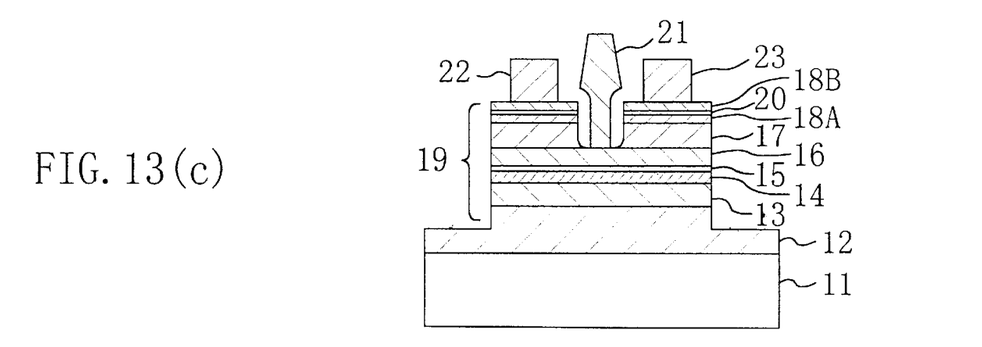

Next, as shown in FIG. 13(a), the cap layer 17, the first and second protective layers 18A, 18B and the second n-type delta doped layer 20 are etched with a phosphate-based etchant, thereby forming the recess 17a in these layers 17, 18A, 18B and 20. Then, as shown in FIG. 13(b), gate metals such as Ti, Pt and Au are evaporated in this order over the entire surface of the substrate 11, thereby depositing a second metal film 25. And the first and second EB resist films 33, 34 are lifted off, thereby exposing the source/drain electrodes 22, 23 and forming the gate electrode 21, consisting of the head and leg portions, out of the second metal film 25 in the recess 17a on the Schottky layer 16 as shown in FIG. 13(c).

In the HEMT formed in this manner, the first and second n-type GaAs protective layers 18A, 18B for preventing In, contained in the cap layer 17, from diffusing toward the ohmic electrodes, i.e., the source/drain electrodes 22, 23, have a combined thickness of 7.5 nm. Thus, as can be understood from the experimental results described above, the contact resistance can be reduced and kept low for a long period of time. As a result, sufficiently high thermal reliability of the HEMT can be attained.

Furthermore, the second n-type delta doped layer 20 is additionally formed between the first and second protective layers 18A and 18B. Accordingly, the contact resistance between the cap layer 17 and the source/drain electrodes 22, 23 as ohmic electrodes can be reduced.

The substrate 11 is made of InP in this embodiment. Alternatively, a semi-insulating substrate made of GaAs may also be used.

In this embodiment, a field effect transistor is exemplified as a semiconductor device of the present invention. However, the present invention is in no way limited to such an embodiment. The same effects can be attained if the present invention is applied to any other semiconductor device including a cap layer (ohmic contact layer) made of a semiconductor containing In. For example, the present invention is applicable to an optical device such as a semiconductor laser device.

What is claimed is:

1. A semiconductor device comprising:
a substrate;
a cap layer formed over the substrate and containing In;
a protective layer formed on the cap layer and consisting of GaAs; and
an ohmic electrode formed on the protective layer,
wherein the thickness of the protective layer is between 5 nm and 15 nm, and the protective layer comprises an n-type delta doped layer.

2. A semiconductor device comprising:
a substrate made of InP;
a cap layer formed over the substrate and consisting of InGaAs;
a protective layer formed directly on the cap layer and consisting of GaAs; and
an ohmic electrode formed on the protective layer,
wherein the thickness of the protective layer is between 5 nm and 15 nm.

3. A semiconductor device comprising:
a substrate;
a cap layer formed on the substrate and consisting of InGaAs;
a protective layer formed directly on the cap layer and consisting of GaAs; and
an ohmic electrode formed on the protective layer,
wherein the thickness of the protective layer is between 5 nm and 15 nm.

4. The device of claim 3, wherein the substrate is a semi-insulating substrate made of InP.

5. A semiconductor device comprising:
a substrate;
a cap layer formed on the substrate and containing InGaAs;
a protective layer formed on the cap layer and consisting of GaAs; and
an ohmic electrode formed on the protective layer,
wherein the thickness of the protective layer is between 5 nm and 15 nm, wherein the protective layer comprises a n-type delta doped layer.

6. A semiconductor device comprising:
a substrate;
a cap layer formed on the substrate and containing InGaAs;
a protective layer formed on the cap layer and consisting of GaAs; and
an ohmic electrode formed on the protective layer,
wherein the thickness of the protective layer is between 5 nm and 15 nm, wherein the protective layer comprises a n-type delta doped layer, and wherein the delta doped layer is made of Si.

* * * * *